(12) United States Patent
Giomataris et al.

(10) Patent No.: US 9,911,581 B2
(45) Date of Patent: Mar. 6, 2018

(54) SPHERICAL DEVICE FOR DETECTING PARTICLES OR RADIATION

(71) Applicant: COMMISSARIAT A L'ENERGIE ATOMIQUE ET AUX ENERGIES ALTERNATIVES, Paris (FR)

(72) Inventors: Ioannis Giomataris, Versailles (FR); Patrick Magnier, Orsay (FR); Jacques Derre, Sceaux (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 137 days.

(21) Appl. No.: 15/136,102

(22) Filed: Apr. 22, 2016

(65) Prior Publication Data

US 2016/0314941 A1    Oct. 27, 2016

(30) Foreign Application Priority Data

Apr. 24, 2015 (FR) ...................... 15 53683

(51) Int. Cl.
- *H01J 37/32* (2006.01)
- *G01T 1/185* (2006.01)
- *G01T 3/00* (2006.01)
- *H01J 47/02* (2006.01)

(52) U.S. Cl.
CPC ........ *H01J 37/32541* (2013.01); *G01T 1/185* (2013.01); *G01T 3/008* (2013.01); *H01J 37/32596* (2013.01); *H01J 47/026* (2013.01)

(58) Field of Classification Search
CPC .......... H01J 37/32541; H01J 37/32596; G01T 1/185; G01T 3/008
See application file for complete search history.

(56) References Cited

U.S. PATENT DOCUMENTS

| | | | |
|---|---|---|---|
| 2013/0015778 A1 | 1/2013 | Li et al. | |
| 2013/0287156 A1* | 10/2013 | Yazdanbod | G21B 1/00 376/137 |
| 2014/0291537 A1* | 10/2014 | Kroes | G01T 1/02 250/374 |

FOREIGN PATENT DOCUMENTS

| EP | 2 492 711 A1 | 8/2012 |
|---|---|---|
| FR | 3 007 848 A1 | 1/2015 |

OTHER PUBLICATIONS

Search Report as issued in French Patent Application No. 1553683, dated Jan. 8, 2016.

* cited by examiner

*Primary Examiner* — David Porta
*Assistant Examiner* — Mindy Vu
(74) *Attorney, Agent, or Firm* — Pillsbury Winthrop Shaw Pittman LLP

(57) ABSTRACT

A device for detecting includes a cathode forming a hollow sphere, filled with an ionisation and amplification gas, and an anode placed at the centre of the hollow sphere by the intermediary of a maintaining cane, wherein the anode is formed by an insulating ball and by at least two conductive balls positioned around the insulating ball and at the same predetermined distance from the insulating ball.

11 Claims, 2 Drawing Sheets

SPHERICAL DEVICE FOR DETECTING PARTICLES OR RADIATION

CROSS REFERENCE TO RELATED APPLICATIONS

This application claims priority to French Patent Application No. 1553683, filed Apr. 24, 2015, the entire content of which is incorporated herein by reference in its entirety.

FIELD

This invention relates to a spherical device for detecting particles, such as neutrons, or ionising radiation having an improved anode.

BACKGROUND

Figure 1:
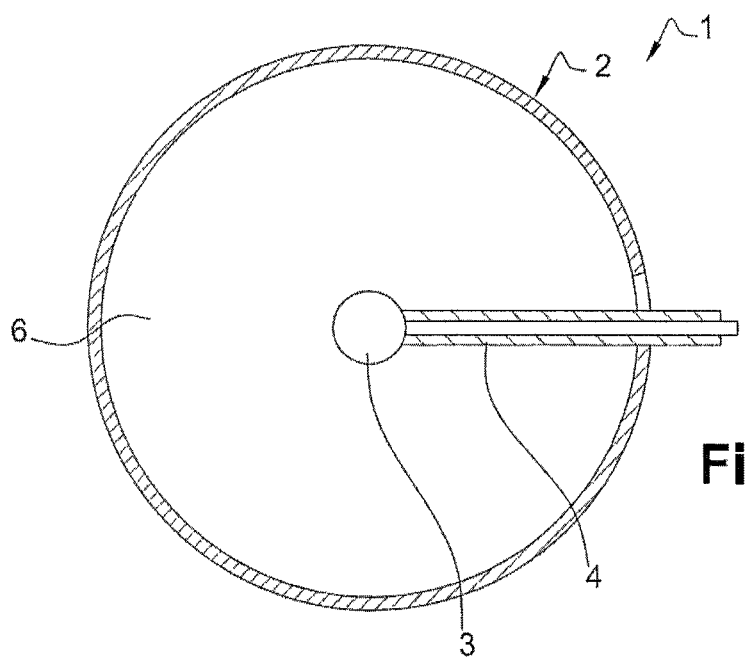

A spherical detector, such as shown in FIG. 1, generally comprises a first electrode 2 (the cathode) forming a hollow spherical enclosure 6 filled with a gas which is used as an ionisation medium and as an amplification medium. A second electrode 3 (the anode) in the shape of a ball is placed and maintained at the centre of the spherical first electrode 2 by means of a maintaining cane 4.

This type of detector is adapted to detect non-ionising particles such as neutrons, neutrinos, gamma radiation or ionising particles such as electrons, positrons and muons. The gas filling the spherical enclosure is as such chosen so that the particles interact with it in order to create charges that will migrate to the anode and which will be amplified in order to create the signal to be measured.

The first spherical electrode 2 is connected to the mass while the second central electrode 3 is brought to a high positive potential. The detecting is carried out by the ionisation of particles of gas that then produce a positively charged ion and a negatively charged ion. The electrical field applied between the electrodes makes it possible:
to divert the electrons created by the ionisation of the gas to the ball by creating a radial field, and;
to produce an "avalanche" in the vicinity of the ball in order to amplify the signal.

For example, in prior art, spherical detectors have substantial volumes, of a magnitude of 1 $m^3$. Indeed, in order to increase the detecting space of the particles or radiation, it is necessary to increase the radius of the spherical enclosure 6. This consequently entails substantially increasing the voltage applied to the anode in order to create an electrical field that is strong enough for it to be able to capture the ionised particles far from the centre of the spherical enclosure 6. The increase in the detecting space of the particles also required rigidifying the support of the anode by increasing the diameter of the maintaining cane 4. As it is necessary to have a central anode with a diameter that is greater than that of the maintaining cane 4 (in order to minimise the "shadow" effects of the maintaining cane), this has for incidence an increase in the potential to be applied on the anode.

Moreover, for certain applications, it is interesting to have devices for detecting that are portable, therefore with reduced dimensions. With this type of device of reduced size, it is necessary to apply a lower potential to the anode in such a way as to prevent the phenomena of breakdowns between the two electrodes that are located close to one another. On the other hand, this potential is generally insufficient to create a satisfactory amplification field.

SUMMARY

In this context, an aspect of the invention aims to propose a spherical detector for the detecting of particles or of radiation that makes it possible to respond to the needs and performance of large-size detectors as well as to the needs and performance of small-size detectors. As such, an aspect of the invention aims to propose a spherical detector that makes it possible to respond to the needs and to the performance of a spherical detector of 10 m in diameter as well as the needs and performance of a spherical detector of 10 cm in diameter.

For this purpose, the invention proposes a device for detecting comprising:
a cathode in the shape of a hollow sphere, filled with an ionisation and amplification gas;
an anode placed at the centre of the hollow sphere by the intermediary of a maintaining cane;
wherein the anode is formed by an insulating ball and by at least two conductive balls positioned around the insulating ball and at the same predetermined distance from said insulating ball.

The device for detecting according to an embodiment of the invention can also have one or several of the characteristics hereinbelow, considered individually or according to all technically permissible combinations:
the at least two conductive balls are connected to the insulating ball by the intermediary of support rods placed perpendicularly to the surface of the insulating ball;
the support rods are hollow;
the insulating ball and/or the at least two conductive balls are hollow;
the at least two conductive balls are evenly distributed around the insulating ball;
the anode comprises at least eight conductive balls;
the anode comprises fourteen conductive balls;
the maintaining cane comprises an insulating element positioned in the vicinity of the anode;
the insulating element has the shape of a plate positioned at the end of the maintaining cane according to a direction perpendicular to the longitudinal axis of the maintaining cane;
the insulating element has the shape of a cone defined by a shaft and by a top, with the shaft of the cone being borne by the maintaining cane and the top of the cone being directed towards the anode;
the maintaining cane is hollow in such a way as to allow the crossing of a system for electrical connection and/or of a system for signal reading (e.g. each system including lines/cables);
the insulating element has the shape of a truncated cone of which the virtual top formed by the cone defines the position of the centre of the anode;
the insulating element forms the first end of the maintaining cane;
the maintaining cane comprises a resistive element partially surrounding the insulating element;
the resistive element is positioned around the insulating element in such a way as to not cover the two ends of the insulating element;
the insulating element has a tapered shape having a half-angle on the top between 1° and 45°, and beneficially between 1° and 10°;
the maintaining cane comprises a resistive element surrounding at least partially an insulating element positioned in the vicinity of a first end whereon the anode is attached, the maintaining cane being passed through by a system for electrical connection making it possible to electrically connect the anode to a first potential and the resistive element of the maintaining cane to a second potential, the second potential being less than the first potential applied to the anode;

the device is a device for the detecting of neutrons.

BRIEF DESCRIPTIONS OF THE FIGURES

Figure 2:
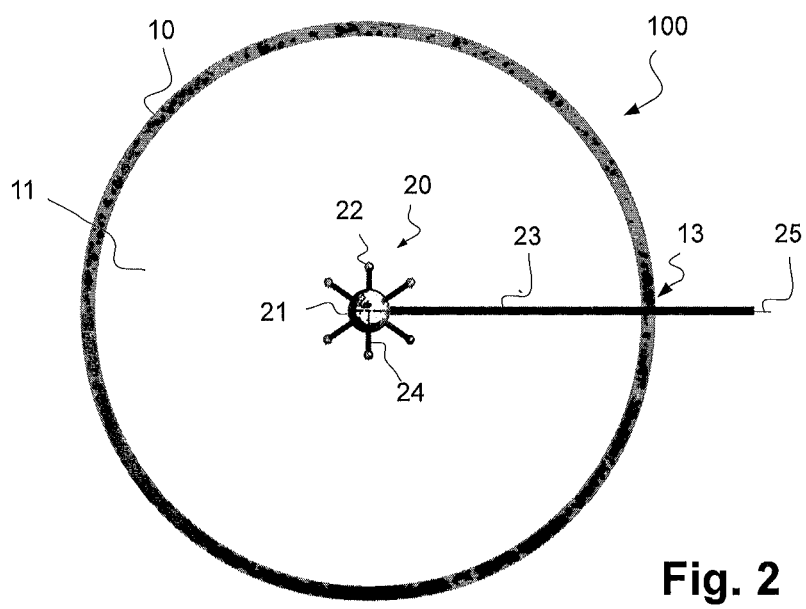
Figure 3:
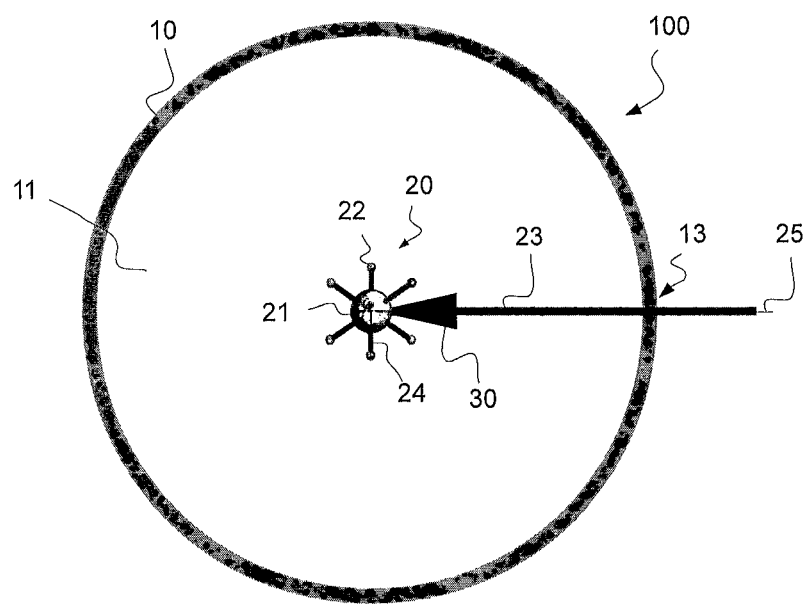

Other characteristics and benefits of the invention will appear more clearly in the description of them provided hereinbelow, for the purposes of information and in no way limiting, in reference to the following figures:

FIG. 1, already described hereinabove, diagrammatically shows a cross-section view of a spherical device for detecting according to prior art;

FIG. 2 diagrammatically shows a first embodiment of a spherical device for detecting according to the invention;

FIG. 3 diagrammatically shows a second embodiment of a spherical device for detecting according to the invention.

DETAILED DESCRIPTION

FIG. 2 shows a device for detecting 100 according to a first embodiment of the invention.

The device for detecting 100 comprises a first electrode 10 forming a hollow spherical enclosure 11. The first electrode 10 is connected to the mass in such a way as to form a cathode. The terms of first electrode or of cathode shall be used indifferently in what follows with the same reference 10.

The device for detecting 100 also comprises a second electrode 20 forming the anode. Identically, the terms of second electrode or of anode shall be used indifferently in what follows with the same reference 20.

The second electrode 20 forming the anode is positioned and maintained at the centre of the first electrode 10 by means of a maintaining cane 23 passing through the wall of the enclosure 11.

The maintaining cane 23 is hollow, and it is passed through by a system for electrical connection 25 making it possible to put the second electrode 20 at the desired potential and allowing a signal to be read (e.g. including lines/cables). The second electrode 20 is as such powered up in such a way as to form the anode of the device for detecting. The system for electrical connection 25 makes it possible to control the electrical field applied in the enclosure 11 by controlling the potential of the anode 20.

The operation of such a device for detecting is in particular described in patent application FR 3007848 A1. Consequently, this application refers to this document and incorporates herein by reference all of the characteristics described in this document.

The device for detecting 100 according to an embodiment of the invention has an anode 20 of which the structure is formed by:

a central ball 21 connected to the maintaining cane 23;

a plurality of satellite balls 22, i.e. at least two, positioned around the central ball 21;

a connector 24, such as support rods, extending according to a radial direction with respect to the surface of the central ball 21, making it possible to position and to maintain the satellite balls 22 around the central ball 21 and at a certain predetermined distance from the central ball 21, with this distance also able to be zero.

The central ball 21 is an insulating ball made from an insulating material, for example of polyetheretherketone (or PEEK for PolyEtherEtherKetone). This insulating central ball is hollow in such a way as to allow for the passage of the system for electrical connection 25 and comprises a plurality of radial orifices distributed over the contour of the surface of the central ball 21 for the passing of the system for electrical connection 25 connected to each one of the satellite balls 22; with the number and the distribution of the radial orifices corresponding to the number and to the distribution of the connectors 24 to maintain satellite balls 22.

These support rods 24 are also hollow in such a way as to allow for the passage of the system for electrical connection 25 inside the support rods 24, the latter as such forming a protective sheath of the system for electrical connection 25.

The satellite balls 22 are conductive balls made for example from stainless steel whereon a single voltage HV1 is applied by the intermediary of the system for electrical connection 25 which are electrically connected to the conductive balls 22.

The satellite balls 22 are evenly distributed around the central ball in such a way as to have a homogeneous distribution. The choice of the number of satellite balls will depend on the size of the sphere and on the size of the central ball 21. The number of satellite balls 22 will be chosen in an embodiment in such a way as to obtain a homogeneous field in the sphere. However, an excessive number of satellite balls 22 would have for effect to cancel the advantages of the invention. Indeed, the anode with its central ball 21 and a large number of satellite balls 22, would behave as a simple deformed ball of large size.

The support rods 24 are of identical length and as such make it possible to position the conductive satellite balls 22 at an equal distance from the insulating central ball 21.

Such a geometry of the anode 20 in the shape of a "hedgehog" as such makes it possible to propose a detector that meets both the needs and the performance of large-size (several metres) and of small-size (a few centimetres) spherical detectors. Indeed, the particular structure of the anode 20 confers it with a double property: it behaves both as a large-size anode and as a small-size anode with high electrical fields for the collection of charges close to the anode for amplification.

A large-size anode refers to an anode able to detect the particles to in the vicinity of the sphere. The size of the anode therefore depends on the size of the spherical enclosure but also on the gas chosen for the detecting as well as the voltage applied.

A small-size anode refers to an anode that is small with respect to the size of the sphere in order to not congest the detecting volume and create electrical fields that are strong enough to cause the amplification (with the intensity of the electrical fields being proportional to $1/r_2$ where r is the radius of the anode).

As such the anode 20 according to an embodiment of the invention makes it possible to collect the avalanche signals which are amplified by a miniature preamplifier with very low electronic noise arranged as close as possible to the insulating central ball 21, even inside the latter.

For example, for the detecting of non-ionising particles, such as neutrons, the gas pressure is at a few bars in the enclosure 11, for example 5 bars, in order to increase their probability of interaction with the gas and a voltage applied to the anode 20 greater than 7 kV so as to migrate the electrons coming from the spherical enclosure 21 to the anode 20. Inversely, for the detecting of very ionising particles it may be necessary to lower the pressure inside the enclosure to a few millibars and to apply voltage to the anode less than 2 kV. For this application, it is possible to use a spherical enclosure 11 having a diameter of 1.3 m with an anode formed by a central ball 21 having a diameter of 10 mm and conductive satellite balls 22 having diameters of 2 mm positioned at 2 mm of the outside surface of the central ball 21.

In an embodiment, the anode 20 is formed by an insulating central ball 21 and by at least eight conductive satellite balls 22 evenly distributed around the central ball 21.

According to another embodiment of the invention, the anode 20 is formed by an insulating central ball 21 and by at least fourteen conductive satellite balls 22 evenly distributed around the central ball 21.

By way of example, the spherical enclosure 11 can be made of aluminium and have a diameter of a magnitude of 200 mm with a wall thickness of a magnitude of 2 mm.

The spherical enclosure 11 has on its wall an opening 13 that allows for the passing of the maintaining cane 23. It will be appreciated, it is provided to use an ad hoc system to seal (e.g. a seal) on the crossing of the spherical enclosure 11 for the passing of the maintaining cane 23.

FIG. 3 shows a second embodiment of the invention. The effect of the voltage applied on the satellite balls 21 will have for effect to migrate the electrons on the surface of the enclosure 11 to the balls 21 powered up. However, the maintaining cane 23 such as described hereinabove connected to the mass of the detector and passing through the enclosure 11 will disturb the electrical field in the vicinity of the maintaining cane 23.

So as to minimise the disturbances of the electrical field linked to the presence of the maintaining cane 23, the device according to an embodiment of the invention comprises an insulating element 30 positioned on the maintaining cane 23 in the vicinity of the anode 20. This insulating element can have the shape of a plate positioned perpendicularly to the longitudinal axis of the maintaining cane or a tapered shape of which the shape is defined by a shaft and by a top, with the shaft of the cone being borne by the maintaining cane 23 (i.e. confounded with the longitudinal axis of the maintaining cane 23) and the top of the cone being directed towards the end of the maintaining cane 23 (i.e. towards the centre of the spherical enclosure, facing the insulating ball 21).

In an embodiment, the insulating element 30 has the shape of a truncated cone in such a way that the truncated top of the cone forms a bearing surface that is large enough to allow for the attaching of the anode 20 to the end of the cone, for example by gluing. The virtual top of the cone shows beneficially the position of the centre of the insulating ball 21 of the anode 20.

The insulating element 30 is beneficially made from a highly insulating plastic material, for example polyetheretherketone (PEEK).

It will be appreciated that the insulating element 30 has a through-orifice central for the passing of the system for electrical connection 25 making it possible to connect the satellite balls 22.

The insulating element 30 of tapered shape has a half-angle $\alpha$ on the top between 1° and 89°, and in an embodiment between 1° and 45° and in another embodiment between 1° and 10°.

As such, the maintaining cane 23 comprising an end made from an insulating material 30 that makes it possible to minimise the disturbances of the electrical field in the spherical enclosure 10 of the device for detecting 100. It can be estimated that with using such a maintaining cane 23, the disturbed zone is less than 20% of the total volume of the sphere, while without the invention about 50% of the sphere is disturbed.

In an embodiment, the outside surface of the insulating element 30 is partially covered by a resistive element electrically connected to a second electrical cable also passing through the maintaining cane 23. To this effect, the insulating element 30 has a through-orifice oriented substantially according to a transverse direction with respect to the longitudinal axis of the maintaining cane 23 in such a way as to allow for the passage of the second electrical cable from the centre of the maintaining cane 23 to the resistive element. The through orifice as such makes it possible to electrically connect the resistive element to a potential HV2, less than the potential HV1 applied to the anode 20.

The resistive element does not fully cover all of the outside surface of the insulating element 30. Indeed, the resistive element is arranged so as to leave "bare" the insulating element 30 on its two ends on either side of the resistive element, in such a way as to prevent any short circuit between the maintaining cane 23 connected to the mass and the anode 20 to the potential HV1.

The application of this second potential on the end of the maintaining cane 23 and in the vicinity of the central ball 21 forming the anode 20 makes it possible to create a progressive discharge of the accumulated charges on the anode 20. This progressive discharge as such makes it possible to limit, and even suppress, the appearance of breakdowns due to the accumulation of these charges. The accumulated charges will as such be eliminated by connecting to the mass via the outer metal walls of the maintaining cane 23 and by the bias of the insulating tapered end. As such, the disturbed zone is reduced to about 10% of the volume of the sphere.

Naturally, the invention is not limited to the embodiments described in reference to the figures and alternatives can be considered without leaving the scope of the invention. For example, the dimensions given in the embodiments for the electrodes could vary, just as the materials that comprise the electrodes and the maintaining cane.

The invention claimed is:

1. A device for detecting comprising:
    a cathode forming a hollow sphere, filled with an ionisation and amplification gas, and
    an anode placed at the centre of said hollow sphere by the intermediary of a maintaining cane,
wherein said anode is formed by an insulating ball and by at least two conductive balls positioned around said insulating ball and at the same predetermined distance from said insulating ball.

2. The device for detecting as claimed in claim 1, wherein said at least two conductive balls are connected to said insulating ball by the intermediary of support rods placed perpendicularly to a surface of said insulating ball.

3. The device for detecting as claimed in claim 2, wherein said support rods are hollow.

4. The device for detecting according to claim 1, wherein said insulating ball and/or said at least two conductive balls are hollow.

5. The device for detecting according to claim 1, wherein said at least two conductive balls are evenly distributed around said insulating ball.

6. The device for detecting according to claim 1, wherein the anode comprises at least eight conductive balls.

7. The device for detecting according to claim 6, wherein the anode comprises fourteen conductive balls.

8. The device for detecting according to claim 1, wherein said maintaining cane comprises an insulating element positioned in the vicinity of the anode.

9. The device for detecting according to claim 8, wherein said insulating element has the shape of a plate positioned according to a direction perpendicular to the longitudinal axis of the maintaining cane.

10. The device for detecting according to claim 8, wherein said insulating element has a tapered shape defined by a shaft and a top, with the shaft of the cone being borne by the maintaining cane and the top of said cone being directed towards the anode.

11. The device for detecting according to claim 1, wherein said maintaining cane is hollow in such a way as to allow the crossing of a system for electrical connection and/or of a system for signal reading.

* * * * *